United States Patent [19]

Kamon

[11] Patent Number: 5,300,967
[45] Date of Patent: Apr. 5, 1994

[54] PROJECTION EXPOSURE APPARATUS

[75] Inventor: Kazuya Kamon, Itami, Japan

[73] Assignee: Mitsubishi Denki Kabushiki Kaisha, Tokyo, Japan

[21] Appl. No.: 922,242

[22] Filed: Jul. 31, 1992

[51] Int. Cl.$^5$ ............................................. G03B 27/72
[52] U.S. Cl. .................................... 353/97; 353/122; 355/71
[58] Field of Search ............... 353/97, 102, 122, 38; 355/71, 67, 52, 77, 53, 55

[56] References Cited

U.S. PATENT DOCUMENTS

| | | | |
|---|---|---|---|
| 3,591,274 | 7/1971 | Donald | 353/97 |
| 4,512,657 | 4/1985 | Sakato | 355/71 |
| 4,970,546 | 11/1990 | Suzuki et al. | 355/71 |
| 5,097,291 | 3/1992 | Suzuki | 355/69 |
| 5,144,362 | 9/1992 | Kamon | 355/71 |
| 5,191,374 | 3/1993 | Hazama et al. | 355/55 |

*Primary Examiner*—Thomas B. Will
*Assistant Examiner*—William C. Dowling
*Attorney, Agent, or Firm*—Leydig, Voit & Mayer

[57] ABSTRACT

A projection exposure apparatus includes a light source; an aperture member having openings for shaping light beams emitted from the light source and having a shielding member formed into a uniform pattern over the entire area of the openings in order to reduce the area of the openings; a light condensing lens for irradiating light beams transmitted through the opening of the aperture member onto a reticule; and a projection lens for condensing light beams transmitted through the reticule onto the surface of a wafer.

15 Claims, 7 Drawing Sheets

PROJECTION EXPOSURE APPARATUS

BACKGROUND OF THE INVENTION

1. Field of the Invention

The present invention relates to a projection exposure apparatus for use in photolithography or the like in an LSI manufacturing process.

2. Description of the Related Art

A conventional projection exposure apparatus is shown in FIG. 10. Light beams emitted from a light source 1, such as a mercury lamp, reach a fly-eye, lens, 3 via a mirror 2 and are divided into a plurality of light beams by the individual lenses 3a which form the fly-eye lens 3. After the light beams have passed through each of the lenses 3a, they each irradiate a reticle via an opening 4a of an aperture member 4, a mirror 5 and a light condensing lens, 6. After the light beams have passed through the reticle 7, each beam reaches a wafer 9 through a projection lens 8. As a result, a pattern formed on the reticle 7 is projected onto the surface of the wafer 9.

When a pattern is exposed using such a apparatus, there are some cases in which the value of the coherency $\sigma$ of the projection exposure optical system must be made small in order to increase the coherence. Accordingly, in the prior art, as shown in FIG. 11, a plurality of openings, 4a, 4b 4c, having different sizes are formed in the aperture member 4. One opening is selected from among these openings and placed in the optical path, thus adjusting the coherency $\sigma$. That is, if the opening 4c having a small opening area is selected, the coherency $\sigma$ of the optical system becomes smaller, that is, it approaches zero. If the opening 4a having a large opening area is selected, the coherency $\sigma$ of the optical system becomes larger.

However, if the opening 4c having a small opening area is selected in order to decrease the coherency $\sigma$, only the illumination light in the peripheral portion of the opening is shielded by the aperture member 4, and thus a problem arises in that the intensity of light at the peripheral portion of the wafer 9 and, thus, the light intensity is not uniform on the wafer.

SUMMARY OF THE INVENTION

The present invention has been achieved to solve the above-mentioned problem of the prior art.

An object of the present invention is to provide a projection exposure apparatus in which nonuniform light intensity does not occur even if the coherency $\sigma$ is made smaller.

The projection exposure apparatus according to one aspect of the present invention comprises a light source; an aperture member having openings for shaping light beams emitted from the light source and having a shielding member formed into a uniform pattern over the entire area of the openings in order to reduce the area of the openings; a light condensing lens for focusing light transmitted through the opening of the aperture member onto a reticle; and a projection lens for condensing light transmitted through the reticle on the surface of a wafer.

The projection exposure apparatus according to another aspect of the present invention comprises a light source; coherency adjustment means, having openings for shaping light emitted from the light source, for changing the area of an opening according to the light shielding pattern formed uniformly over the entire, area of the opening; a light condensing lens for condensing light transmitted through the opening of the coherency adjustment means; and a projection lens for condensing light transmitted through a reticle on the surface of a wafer.

DESCRIPTION OF THE PREFERRED EMBODIMENTS

Preferred embodiments of the present invention will be explained below with reference to the accompanying drawings.

Figure 1:
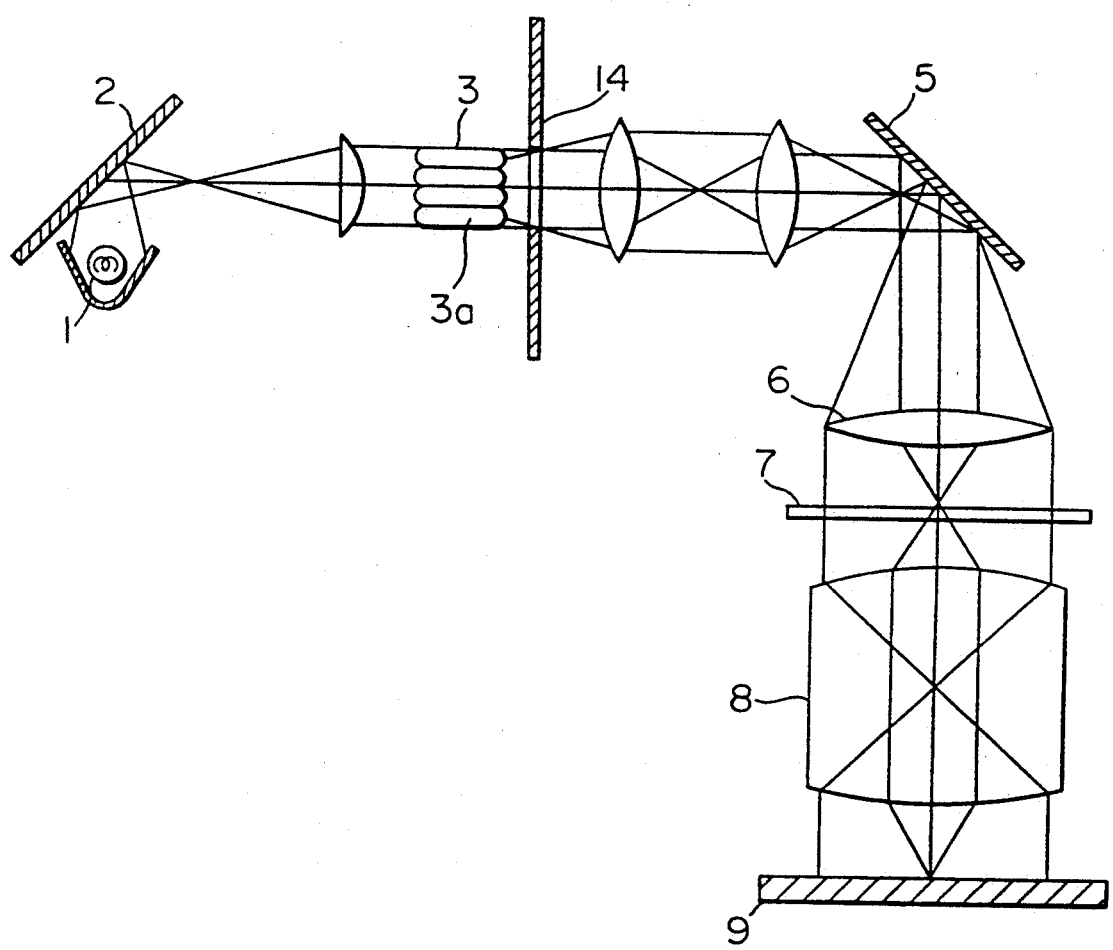
FIG. 1 is a view illustrating a projection exposure apparatus according to an embodiment of the present invention.
Figure 10:
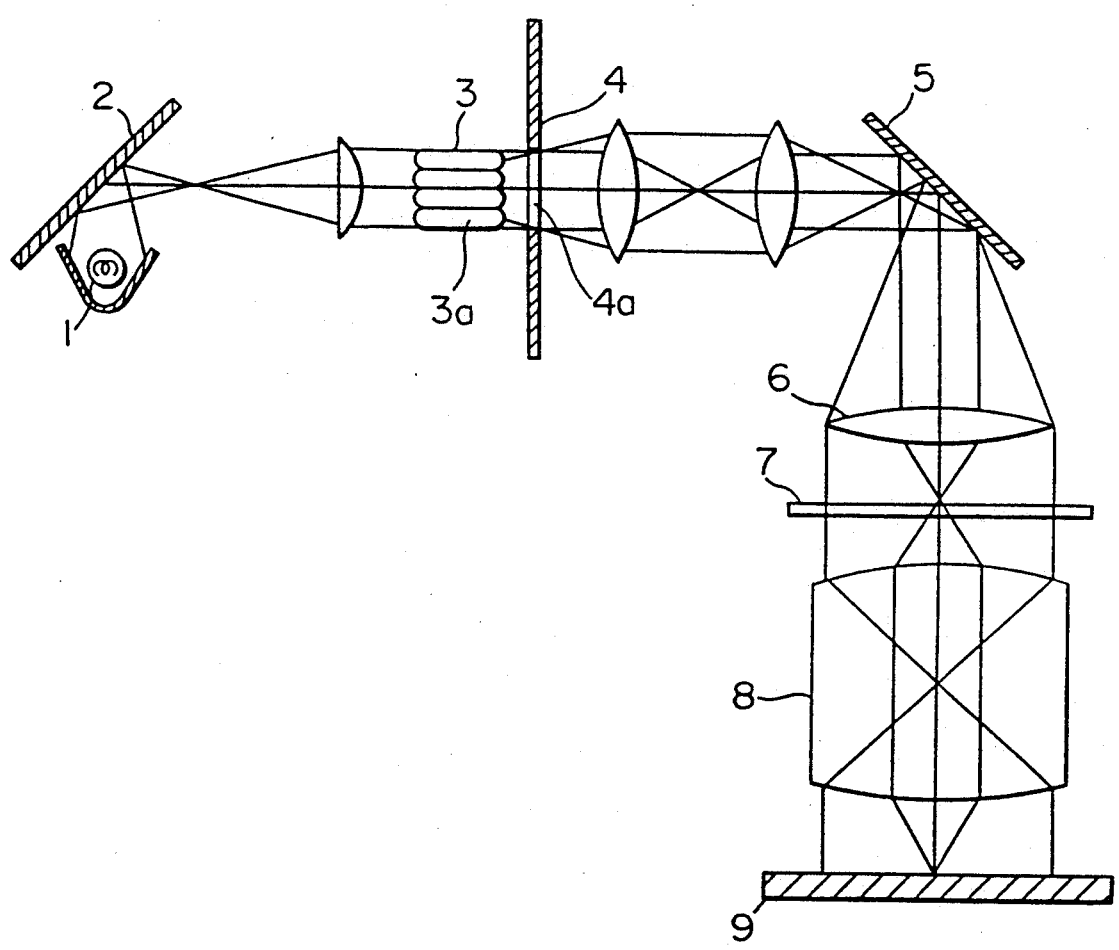
FIG. 10 is a view of a conventional projection exposure apparatus.
Figure 11:
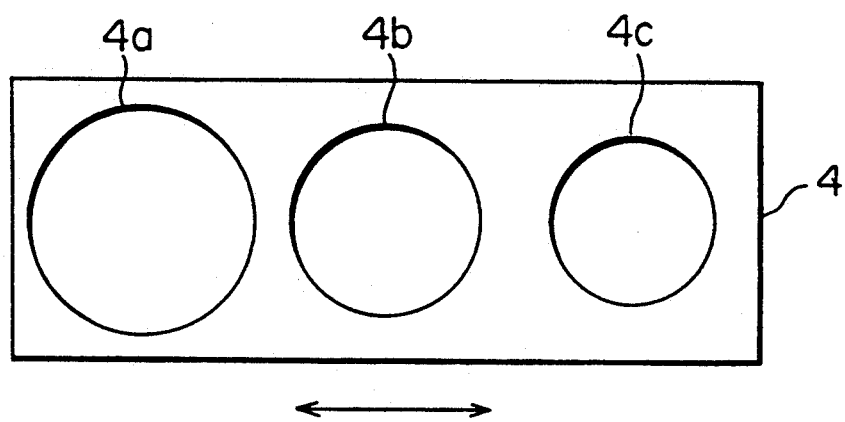
FIG. 11 is a view of a conventional aperture member.

In FIG. 1, the fly-eye lens 3 is positioned ahead of the light source 1, such as a mercury lamp, and the mirror 2 is positioned between the fly-eye lens 3 and the light source 1. In place of the aperture member 4 in the conventional apparatus shown in FIG. 10, an aperture member 14 is positioned ahead of the fly-eye lens 3, the mirror 5 ahead of the member 14, the light, condensing lens 6 ahead of the mirror 5, and the reticle 7 having a pattern formed thereon ahead of the lens 6. In addition, the projection lens 8 is positioned ahead of the reticle 7 and the wafer 9 ahead of the lens 8.

Figure 2:
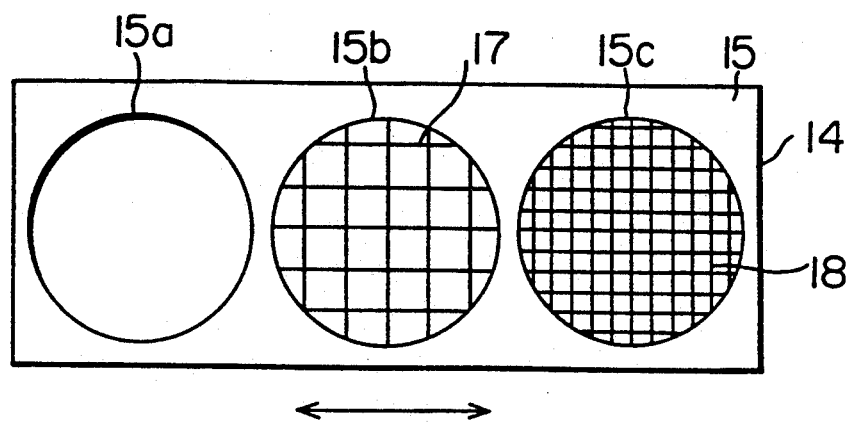
FIG. 2 is a plan view illustrating an aperture member used in the embodiment of FIG. 1.

The aperture member 14, which is a feature of this embodiment, is shown in FIG. 2. Three openings 15a to 15c having radiuses equal to each other are formed in a frame 15 of the aperture member 14. The frame 15 is obtained by forming a light shielding member of the pattern such that three circles are hollowed out on a single transparent board. Even though the transparent board is under the first opening 15a, the transparent board may be hollowed out to make the inside of the opening 15a hollow. A mesh light-shielding pattern is formed on the transparent board over the entire area of each of the second and third openings, 15b and 15c. The light shielding pattern of the second opening 15b is a coarse mesh, whereas the light shielding pattern of the third opening 15c is a fine mesh. These light shielding patterns are respectively obtained by forming a light shielding member of a metal or the like on a transparent board. The aperture member 14 is slidably disposed in the direction of the arrow in FIG. 2. It is possible to select one opening from among the three openings 15a to 15c and dispose it on the optical axis of the projection exposure apparatus.

Next, the operation of this embodiment will be explained. Light emitted from the light source 1 reach the fly-eye lens 3 via the mirror 2 and is divided by the individual lenses 3a which form the fly-eye lens 3 into light beams. After the light beams have passed through each of the lenses 3a, they each irradiate the reticle 7 via one of the openings 15a to 15c of the aperture member 14, the mirror 5 and the light condensing lens 6. After the light beams have passed through the reticle 7, each beam reaches the wafer 9 via the projection lens 8. As a result, the circuit pattern formed on the reticle 7 is projected onto the surface of the wafer 9.

Figure 3:
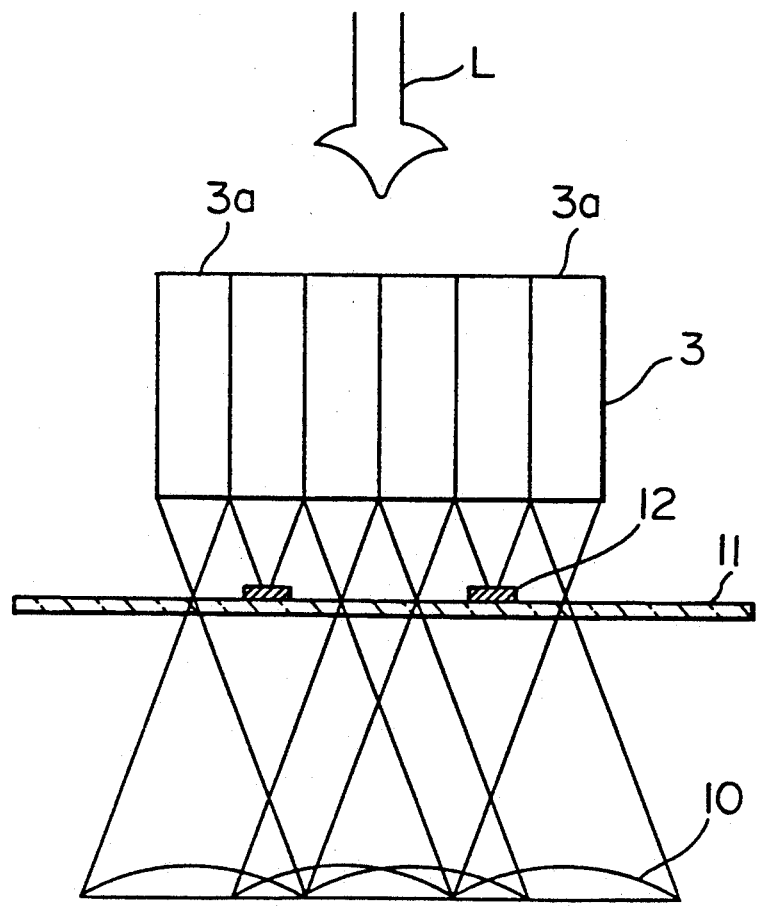
FIG. 3 illustrates the operation of the embodiment of FIG. 1.

Referring now to FIG. 3, the respective operations of the fly-eye lens 3 and the aperture member 14 will be explained. Light from the light source 1 enters the fly-eye lens 3, then light beams emerging from each of the lenses 3a are dispersed after they are each brought into focus once, and are superposed on each other. In FIG. 3, reference numeral 10 denotes the distribution of the intensity of light emerging from each of the lenses 3a. As a result, the light is averaged, but the coherency $\sigma$ becomes larger because the light beams from each of the lenses 3a are superposed on each other.

For this reason, when an optical system having a small coherency $\sigma$ is required, the second opening 15b or the third opening 15c of the aperture member 14 is positioned on the optical axis. In this case, as shown in FIG. 3, some of the light beams from the plurality of the lenses 3a are shielded by a light shielding pattern 12 formed on a transparent board 11 of the aperture member 14. As a result, the coherency $\sigma$ of the optical system decreases. Also, since the three openings 15a to 15c of the aperture member 14 have radiuses equal to each other, even if the coherency $\sigma$ is decreased by using the second and third openings 15b and 15c, this does not result in shielding of by the illumination light only in the peripheral portion by the aperture member 14, thus preventing the intensity of light on the wafer 9 from becoming nonuniform.

Figure 4:
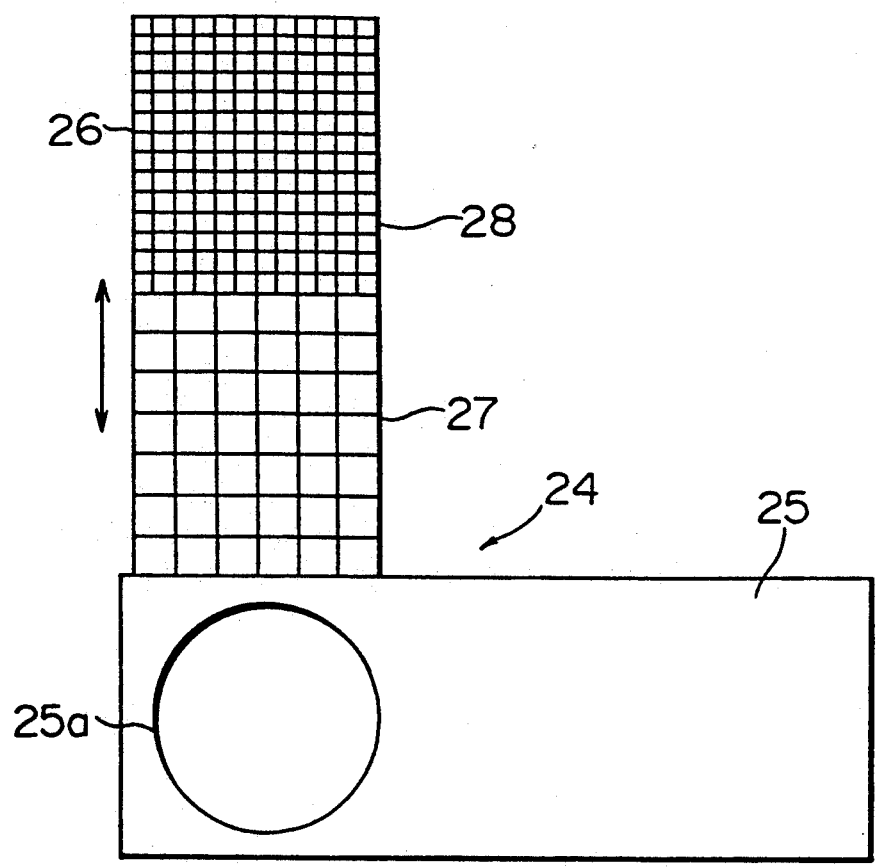
FIGS. 4 to 9 are plan views respectively illustrating aperture members used in other embodiments of the invention.

FIG. 4 illustrates an aperture member 24 in a modification of the first embodiment of the present invention. Only one opening 25a is formed on an outer frame 25, whereas a plurality of mesh light shielding patterns, 27 and 28, whose degrees of coarseness are different from each other, are formed on a transparent board 26. By sliding the transparent board 26 in the direction of the arrow in FIG. 4, either one of the light shielding patterns 27 and 28 is positioned in the opening 25a. As a result, the area of the opening can be changed while the radius of the opening is kept fixed.

Figure 5:
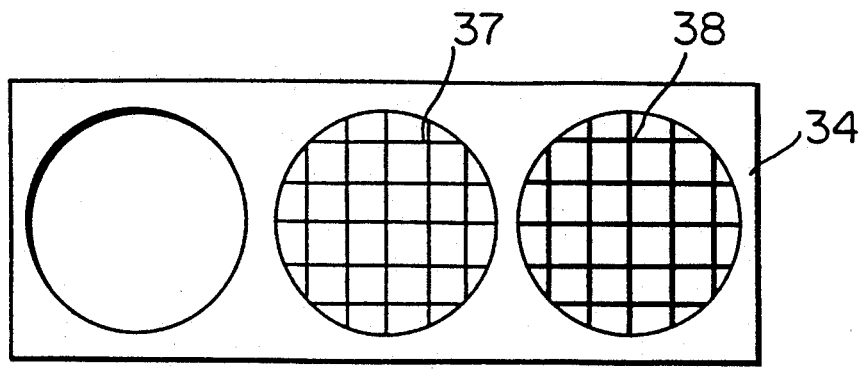

Even though the area of the openings in the aperture members 14 and 24, shown in FIGS. 2 and 4, respectively, is changed by varying the degree of the coarseness of the mesh, the present invention is not limited to such a case. For example, as in an aperture member 34 shown in FIG. 5, the area of the opening can be changed by forming a plurality of light shielding patterns, 37 and 38, having degrees of mesh coarseness equal to each other but line widths, which lines form the mesh, different from each other.

Figure 6:
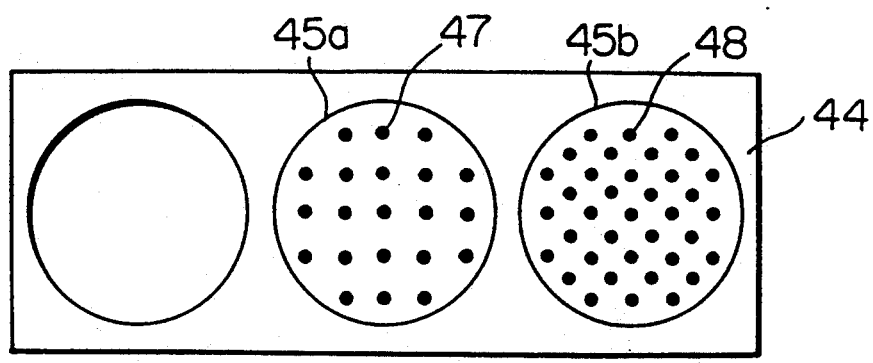
Figure 7:
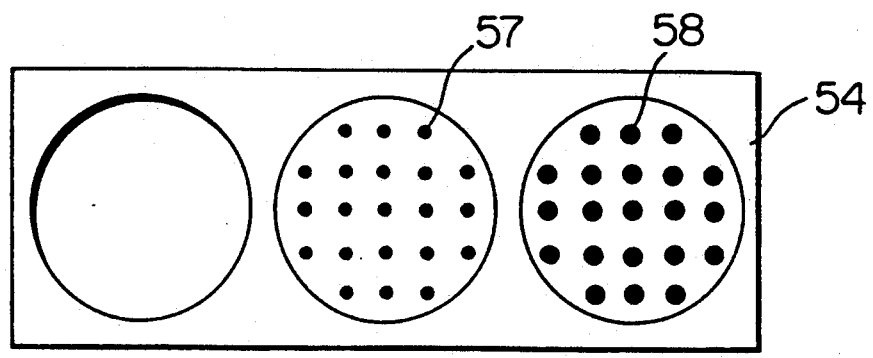

In addition, the light shielding patterns are not limited to the mesh form, but, may be, as in an aperture member 44 shown in FIG. 6, light shielding patterns 47 and 48 having the form of a great number of dots distributed over the entire areas of openings 45a and 45b. Since the number of dots of the light shielding pattern 48 is greater than that of the light shielding pattern 47, the area of its opening is decreased by an amount proportional to the difference between these respective numbers of dots. Thus, use of the light shielding pattern 48 enables the coherency $\sigma$ to be made smaller. Also, as in an aperture member 54 shown in FIG. 7, the area of this member's opening can be varied by forming a plurality of light shielding patterns 57 and 58, whose respective numbers of dots are equal to each other but whose dot sizes are different from each other.

Figure 8:
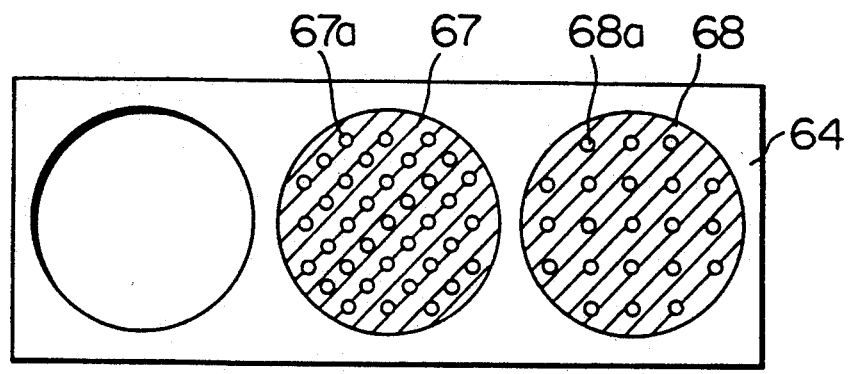
Figure 9:
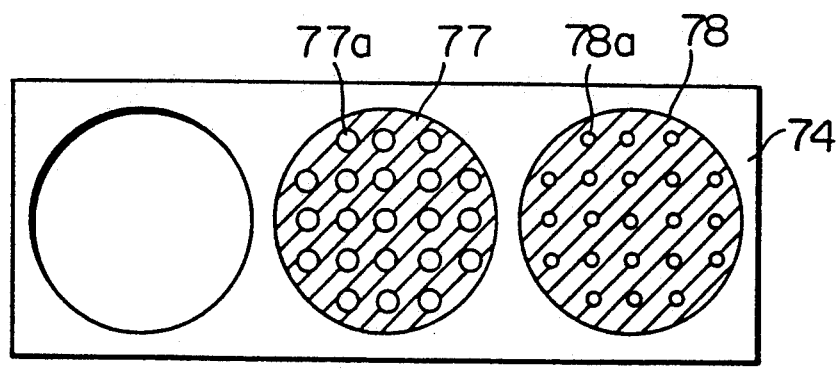

In an aperture member 64 shown in FIG. 8, light shielding patterns 67 and 68 having a plurality of respective transmission windows 67a and 68a spread over the entire areas of openings 65a and 65b are formed. Light from the light source 1 is transmitted through the transmission windows 67a or 68a, and travels toward the reticle 7. In this case, the sum of the areas of each of the transmission windows 67a or 68a is equal to the area of the openings of the aperture member 64. Since the number of transmission windows 68a of the light shielding pattern 68 is less than that of the light shielding pattern 67, the areas of the openings can be made smaller by an amount proportional to the difference between these numbers of transmission windows and the coherency $\sigma$ made smaller. As in an aperture member 74 shown in FIG. 9, the area of openings thereof can be changed by forming a plurality of light shielding patterns, 77 and 78, whose respective numbers of transmission windows 77a and 78a are equal to each other but whose window sizes are different from each other.

Even though in the above-described embodiments, each of the openings is formed into the shape of a circle, they may be an other shape, such as a rectangle.

What is claimed is:

1. A projection exposure apparatus comprising:
    a light source for emitting light;
    an aperture member having a plurality of openings, each opening having a respective area, for shaping light emitted from said light source and a respective light shielding member with a pattern of opaque dots uniformly distributed within the corresponding opening to vary the area of the respective openings transmitting light;
    a light condensing lens for irradiating a reticle with light transmitted through one of the openings of said aperture member; and
    a projection lens for condensing light transmitted through the reticle onto a wafer.

2. The projection exposure apparatus according to claim 1 comprising a fly-eye lens for dividing light emitted from said light source into a plurality of light beams.

3. A projection exposure apparatus comprising:
    a light source for emitting light;
    coherency adjustment means having a plurality of openings for shaping light emitted from said light source, the openings including respective light shielding patterns of opaque dots distributed uniformly over the corresponding opening;
    a light condensing lens for irradiating a reticle with light transmitted through one of the openings of said coherency adjustment means; and
    a projection lens for condensing light transmitted through the reticle onto a wafer.

4. The projection exposure apparatus according to claim 3 wherein said coherency adjustment means includes two light shielding patterns respectively comprising different numbers of opaque dots.

5. The projection exposure apparatus according to claim 3 wherein said coherency adjustment means includes two light shielding patterns respectively comprising different sizes of opaque dots.

6. The projection exposure apparatus according to claim 3 comprising a fly-eye lens for dividing light emitted from said light source into a plurality of light beams.

7. A projection exposure apparatus comprising:
    a light source for continuously emitting light;
    a reticle including a pattern having light transmissive regions;

an optical system for projecting the pattern of the reticle onto a surface of a wafer with light continuously emitted by the light source and including a light source surface disposed between the light source and the reticle and having an aperture; and coherency adjusting means for controlling light distribution within the aperture in the light source surface of the optical system including a light shielding pattern in the aperture comprising a mesh of wires wherein one of the wires passes through a center of the aperture to modulate the coherency of the optical system.

8. The projection exposure apparatus according to claim 7 wherein said coherency adjusting means includes a plurality of light shielding patterns respectively comprising wires of different sizes arranged in respective meshes.

9. The projection exposure apparatus according to claim 7 wherein said coherency adjusting means includes a plurality of light shielding patterns respectively comprising different quantities of wires in respective meshes.

10. A projection exposure apparatus comprising:
a light source for continuously emitting light;
a reticle including a pattern having light transmissive regions;
an optical system for projecting the pattern of the reticle onto a surface of a wafer with light continuously emitted by the light source and including a light source surface disposed between the light source and the reticle and having an aperture; and
coherency adjusting means for controlling light distribution within the aperture in the light source surface of the optical system including a light shielding pattern comprising a plurality of opaque dots to modulate the coherency of the optical system.

11. The projection exposure apparatus according to claim 10 wherein said coherency adjusting means includes a plurality of light shielding patterns respectively comprising opaque dots of different sizes in respective patterns.

12. The projection exposure apparatus according to claim 10 wherein said coherency adjusting means includes a plurality of light shielding patterns respectively comprising opaque dots of different quantities in respective patterns.

13. A projection exposure apparatus comprising:
a light source for continuously emitting light;
a reticle including a pattern having light transmissive regions;
an optical system for projecting the pattern of the reticle onto a surface of a wafer with light continuously emitted by the light source and including a light source surface disposed between the light source and the reticle and having an aperture; and
coherency adjusting means for controlling light distribution within the aperture in the light source surface of the optical system including a light shielding pattern comprising a plurality of light transmission windows for transmitting light to modulate the coherency of the optical system.

14. The projection exposure apparatus according to claim 13 wherein said coherency adjusting means includes a plurality of light shielding patterns respectively comprising a plurality of spaced apart light transmitting windows of different sizes arranged in respective patterns.

15. The projection exposure apparatus according to claim 13 wherein said coherency adjusting means includes a plurality of light shielding patterns respectively comprising a plurality of spaced apart transmitting windows of different quantities arranged in respective patterns.

* * * * *